United States Patent [19]

Camarda et al.

[11] Patent Number: 5,598,632
[45] Date of Patent: Feb. 4, 1997

[54] METHOD FOR PRODUCING MICRO HEAT PANELS

[75] Inventors: Charles J. Camarda, Virginia Beach, Va.; George P. Peterson, College Station, Tex.; Donald R. Rummler, Hampton, Va.

[73] Assignees: The United States of America as represented by the Administrator of the National Aeronautics and Space Administration, Washington, D.C.; Texas A&M, College Station, Tex.

[21] Appl. No.: 320,622

[22] Filed: Oct. 6, 1994

[51] Int. Cl.$^6$ ............................................. B23P 15/26
[52] U.S. Cl. ............................ 29/890.032; 29/890.031
[58] Field of Search ........................ 165/104.33, 104.26, 165/905; 29/890.032, 890.031

[56] References Cited

U.S. PATENT DOCUMENTS 4,196,504  4/1980  Eastman ........................... 29/890.032

Primary Examiner—Irene Cuda
Attorney, Agent, or Firm—Robin W. Edwards

[57] ABSTRACT

Flat or curved micro heat pipe panels are fabricated by arranging essentially parallel filaments in the shape of the desired panel. The configuration of the filaments corresponds to the desired configuration of the tubes that will constitute the heat pipes. A thermally conductive material is then deposited on and around the filaments to fill in the desired shape of the panel. The filaments are then removed, leaving tubular passageways of the desired configuration and surface texture in the material. The tubes are then filled with a working fluid and sealed. Composite micro heat pipe laminates are formed by layering individual micro heat pipe panels and bonding them to each other to form a single structure. The layering sequence of the micro heat pipe panels can be tailored to transport heat preferentially in specific directions as desired for a particular application.

16 Claims, 3 Drawing Sheets

5,598,632

METHOD FOR PRODUCING MICRO HEAT PANELS

BACKGROUND OF THE INVENTION

1. Field of the Invention

The present invention relates generally to the formation of heat pipe panels and more particularly to composite micro heat pipe laminates formed from a plurality of individual micro heat pipe panels and a method of forming micro heat pipe panels.

2. Description of the Related Art

Micro heat pipes are small, wickless heat pipes which have a hydraulic diameter of the same order-of-magnitude as the capillary radius of the working fluid. Liquid transport is accomplished by the formation of a meniscus of fluid in the corners of the heat pipe due to the surface tension forces of the working fluid. The cross-sectional dimension of such heat pipes is on the order of 0.01 to 0.1 inches and the length is on the order of inches.

The concept of using heat pipes for thermal management has been used in applications ranging from semiconductor devices to the leading edges of various aircraft structures. In leading edge applications, active cooling alone cannot accomodate the magnitude and local nature of the heating associated with shock interference heating on the engine cowl lip of a hypersonic vehicle. The heating can be as high as 100,000 BTU/ft$^2$-sec over a 0.01-inch region. The purpose of the micro heat pipe panel is to distribute the heat over a large area so it can be effectively absorbed by an alternate system, such as active cooling (e.g., forced convection). The small size of the individual heat pipes within the micro heat pipe panel also enable an increase surviability in the event of a particle penetration or puncture.

Small width heat pipe panels using the same principles as the leading edge application can also be bonded to the underside of micro chips to enhance cooling and reliability and prolong the life of the electronics. In both these applications,the micro heat pipes re essentially parallel and embedded in the panel material.

Current methods of micro heat pipe fabrication are described by Cotter in reference to silicon micromechanical devices and typically include forming channels in a substrate followed by enclosing the channels, e.g., by bonding a plate to the substrate surface. Cotter, T. P., 1984, "Princaples and Prospects of Micro Heat Pipes", Proc. 5th Int'l Heat pipe Conf. Tsukuba, Japan, pp. 329–330.

In a related method, U.S. Pat. No. 5,179,043 to Weichold et al. discloses a method of cooling integrated circuit chips using micro heat pipes. Methods of forming the heat pipes on a surface of the chips are also disclosed. A groove,e.g., rectangular or trapezoidal, is cut into a semiconductor substrate. After grooving, layers of heat conductive material are formed on the chips by vapor deposition. This material seals the grooves, leaving micro heat pipe channels of roughly trianglar cross-section.

These techniques for micro heat pipe fabrication permit only a limited number of configurations of the tubes that define the micro heat pipes, U.S. Pat. No. 5,219,020 to Akachi discloses a structure of a micro heat pipes, having an enlongated metallic capillary tube having an inner diameter of up to 1.2 mm. A bi-phase compressible working fluid is sealed in the capillary tube to form a loop-type flow path between alternately arranged heat receiving portions and heat radiating portions.

In another example of tube formation, Japanese Publication No.55-99586 to Saski discloses manufacturing of extra fine heat pipes using extra fine glass fiber tube rather than conventional metallics. And in another example of tube formation, Japanese Publication No. 63-226595 to Nakabashi discloses a micro heat pipe comprising a capillary tube having a working fluid inside. The pipe has an inner diameter of 2–3 mm.

A leading edge structure is illustrated by U.S. Pat. No. 5,042,565 to Yuen et al. which discloses a fiber-reinforcing composite leading edge heat exchanger and a method for producing the same. The heat exchanger includes a V-shaped composite wall that houses parallel passages. The wall thickness is typically less than 0.05 inches.

As illustrated by the above examples, in situ formation of micro heat pipes results in limitations on the possible tube configuration. In addition, existing panel configurations containing embedded micro heat pipes typically have a parallel heat pipe arrangement resulting in thermal conductivity that is limited to the direction of the heat pipes. Thus, there is a need in the art for a wider variety of embedded micro heat pipe configurations and increased effective thermal conductivity beyond that achievable with an array of parallel micro heat pipes. It, therefore, is an object of this invention to provide an improved micro heat pipe panel and composite micro heat pipe laminate which can have diverse tube configurations and which can improve the effective in-plane thermal conductivity.

SUMMARY OF THE INVENTION

Accordingly, flat or curved micro heat pipe panels of the present invention are fabricated by arranging essentially parallel filaments in the shape of the desired panel. The configuration of the filaments corresponds to the desired configuration of the tubes that will constitute the heat pipes. Filaments with various surface roughnesses can also be used to create a roughened internal surface of the individual tubes to enhance liquid transport within the tubes. In addition, the filaments must be made of a material that is stable during deposition of the panel material and which can be subsequently removed from the formed panel. A thermally conductive material is then deposited on and around the filaments to fill in the desired shape of the panel. The filaments are then removed, leaving tubular passageways of the desired configuration and surface texture in the material. Removal of the filaments is accomplished by leaching out the filament or mechanically removing it. The tubes are then filled with a working fluid and sealed.

Composite micro heat pipe laminates are formed by layering individual micro heat pipe panels and bonding them to each other to form a single structure. Each micro heat pipe panel is rotated in-plane so that the micro heat pipe arrays in adjacent panels are rotated relative to each other. This relative rotation of layered panels improves the effective thermal conductivity of the laminate by increasing the number of array directions and thereby increasing the number of directions available for thermal flow. The layering sequence of the micro heat pipe panels in the composite micro heat pipe laminate can thus be tailored to transport heat preferentially in specific directions as desired for a particular application.

BRIEF DESCRIPTION OF DRAWINGS

Other objects, features and advantages of the present invention will become more fully apparent from the follow- BRIEF DESCRIPTION OF THE DRAWINGS (cont.)

DESCRIPTION OF THE PREFERRED EMBODIMENTS

Figure 1:
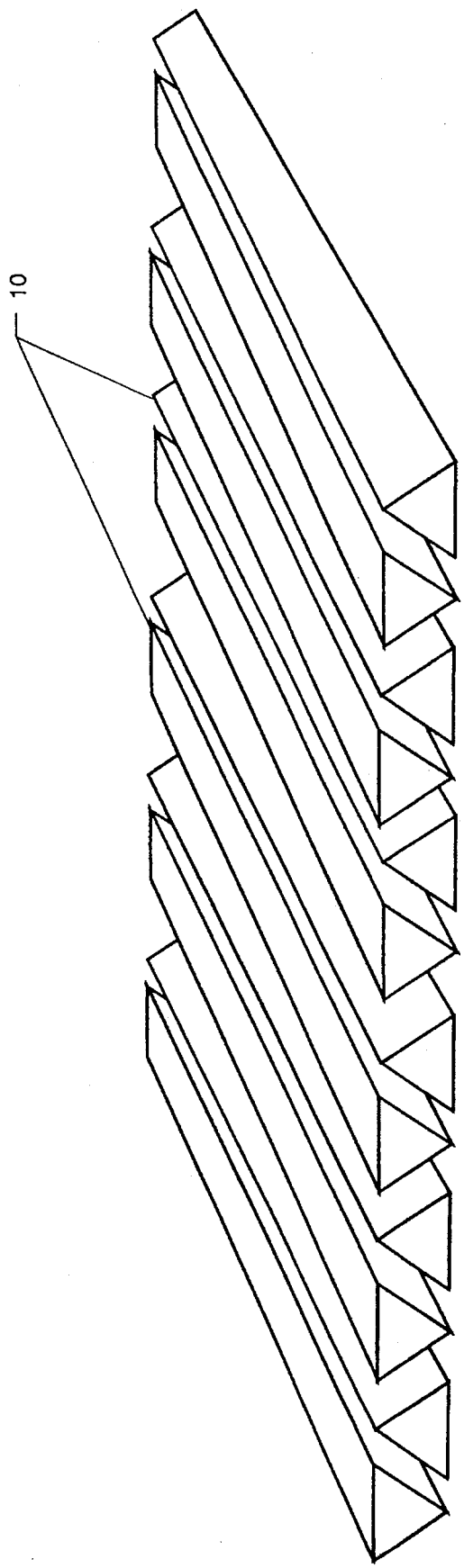
FIG. 1 is a three-dimensional diagram of the filament array for a flat panel prior to deposition of the thermally conductive panel material.
Figure 2:
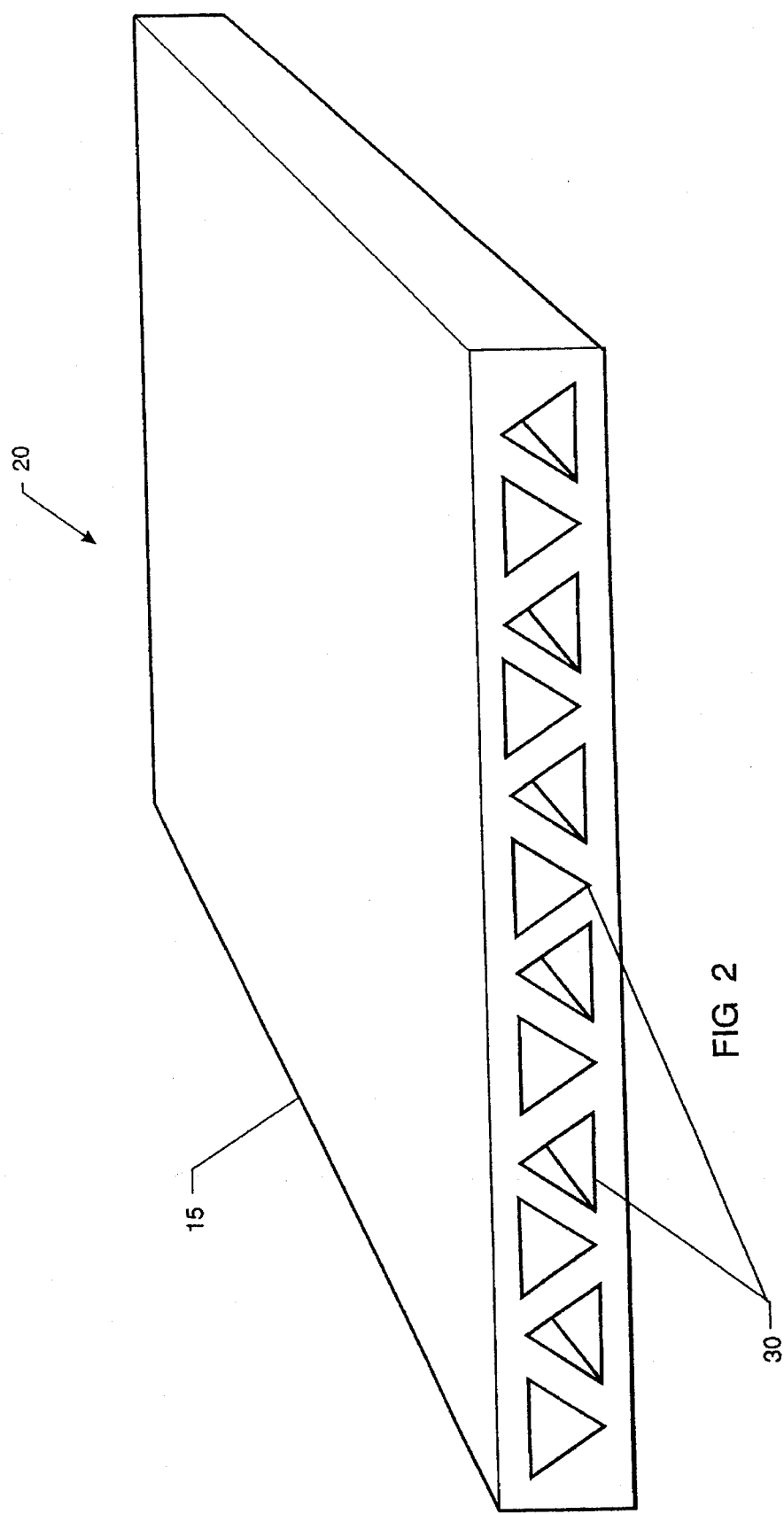
FIG. 2 is a three-dimensional diagram of a micro heat pipe panel according to the present invention.
Figure 3:
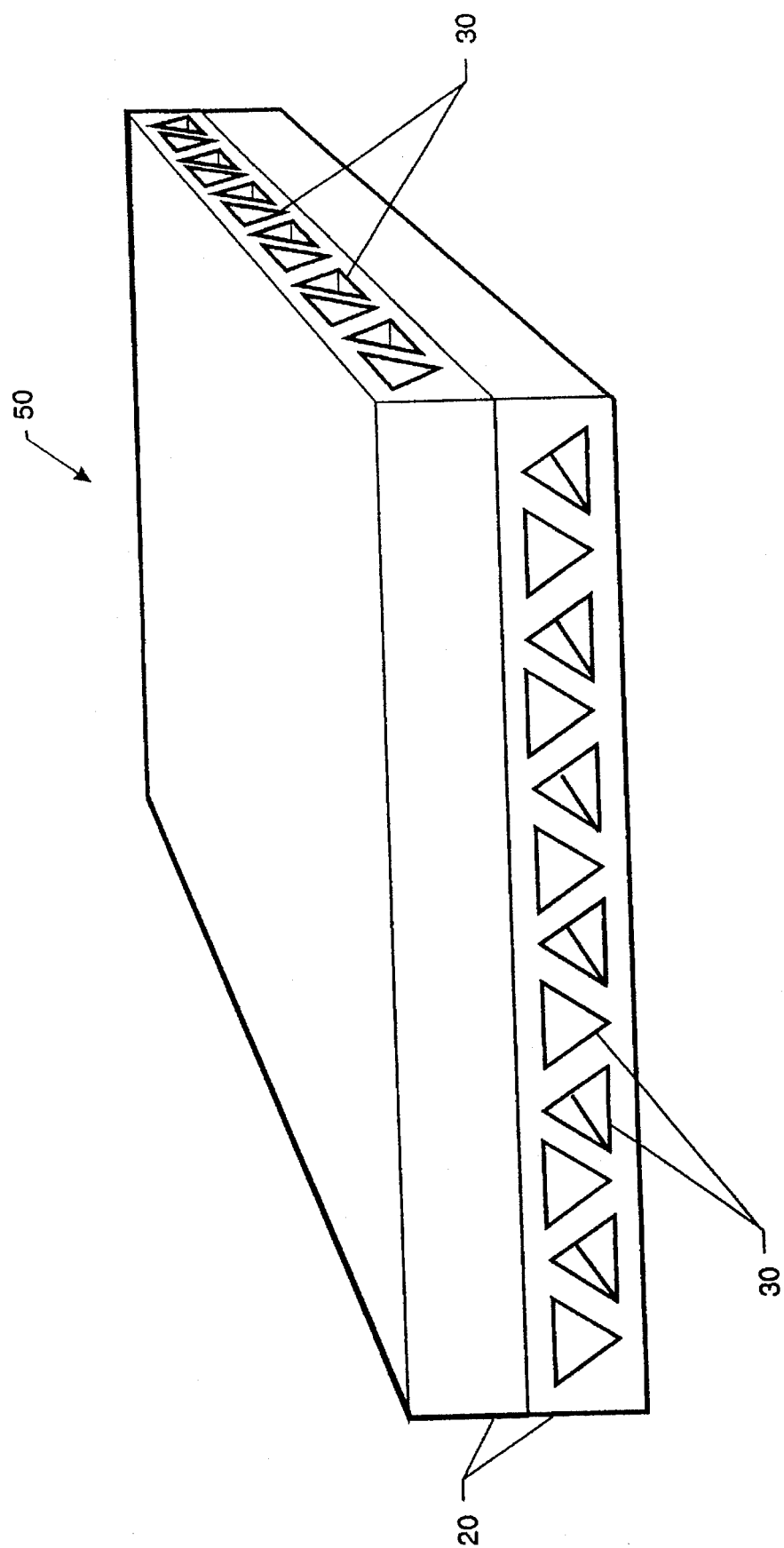
FIG. 3 is a three-dimensional diagram of a composite micro heat pipe laminate formed from layered micro heat pipe panels.

The preferred embodiment of the present invention is illustrated in FIGS. 1 thru 3. With specific reference to FIGS. 1 and 2, a micro heat pipe panel 20 is formed by placing filaments 10 to conform with the desired shape of the panel. For example, in FIG. 1, molybdenum filaments 10 with a triangular cross section are laid out to define a flat panel. A thermally conductive material 15 is then vapor deposited on and around the filaments 10 to form the final panel shape. For this purpose, tungsten and tungsten-rhenium have been found to be particularly suitable. The filaments 10 are then mechanically removed from the panel 20 leaving behind tubular passageways 30. One edge of the panel 20 having the tube openings is sealed and the open edge is fitted with a manifold for evacuating and filling all the micro heat pipes. Alternatively, the panel can be fabricated with one of the edges containing the tube ends sealed. A high-temperature working fluid such as lithium is then placed in each micro heat pipe and the edge of the panel having the remaining tube openings is sealed.

In FIG. 3, two micro heat pipe panels 20 fabricated according to the above method are layered and bonded to form a composite micro heat pipe laminate 50. The upper panel is rotated relative to the lower panel to vary the relative orientations of adjacent arrays of tubes 30 and better transport heat in two directions. In the preferred embodiment illustrated in FIG. 3, only two panels 20 are shown, with the tube array of the upper panel oriented at a right angle to the tube array of the bottom panel. With the tubes 30 filled with working fluid and sealed, this configuration would exhibit orthotropic thermal conductivity in the plane of the panel 50. In addition, the multiple layers could serve to add redundancy in the design of various thermal management systems. The principal application of the present invention is to act as a highly conductive outer skin for a cooled leading edge of an engine cowl, or the leading edge or cowl leading edge of a hypersonic vehicle. The composite micro heat pipe laminate would spread the extremely high, local heating near these leading edges over a larger area to enable the efficient absorption of the heat by some other means such as backside convective/conductive cooling. In another application, spaceborne systems could be laser hardened using the composite micro heat pipe laminate of the present invention coupled with a passive heat absorbing medium such as a phase-change material. The laminate would disperse a local laser strike over a large area and thus prevent a local failure to associated structures such as a radiator element of a satellite or space station. This invention could also be used could also be used for thermal management in micromechanical devices.

Although the preferred embodiment shows only a two-layered composite micro heat pipe laminate 50 with the micro heat pipe arrays positioned orthogonal to each other, other configurations are possible. The number of layers can be increased and the relative rotations of adjacent layers of micro heat pipe panels can be modified in order to increase the effective thermal conductivity of the panel by providing multiple thermal flow paths represented by each layer in the laminar panel.

While the micro heat pipe panel and composite micro heat pipe laminate of the present invention have been disclosed in connection with the above mentioned preferred embodiment, it should be appreciated that alternate embodiments fall within the scope of the invention. For example, the filaments may be graphite, glass, metal or any other material that can create the desired heat pipe shape and texture and remain substantially stable during subsequent processing steps. The material selected for the filaments must also be amenable to removal from the panel by chemical or mechanical means after the panel is formed.

In addition to tungsten, alternate thermally conductive materials may also be selected based on their ability to withstand the expected operating conditions of the panel. For example, metals such as molybdenum-rhenium and columbium may be used for high-temperature applications; a superalloy may be used for moderate temperatures; and metals such as aluminum or copper may be used for low temperature applications. Although vapor deposition is a particularly effective method of depositing the thermally conductive material to form the micro heat pipe panel, it is also possible to use a mechanical deposition method such as hot isostatic pressing.

In addition to mechanically removing the filaments from the formed panel, various techniques can be used to facilitate removal of the filaments after deposition of the thermally conductive material. For example, the filament materials may be leached out using known chemical means. In addition, it is possible to coat the filaments with a release agent prior to the deposition step to aid mechanical removal of the filaments. For flat or nearly flat panels, the filaments may also be selected with a significant difference in thermal expansion from the deposited panel material such that the filaments contract upon cooling from the deposition temperature to enable easier removal.

The selection of a particular working fluid depends on the use temperature, application and compatibility of the fluid with the surrounding micro heat pipe material. Working fluids for high to lower operating temperature micro heat pipe panels can range from the liquid metals such as lithium to water, respectively. The amount of liquid fill for the micro heat pipes is predetermined for optimum performance by methods well known to those skilled in the art. The amount is controlled by the level of liquid fill in the panel. The liquid level can be determined by heating the working fluid, and filling the panel while monitoring the liquid level by a thermal imaging device (e.g., IR thermography, neutron radiography, or gamma densitometry). After the working fluid is placed in the tubes, the open ends are sealed.

While the present invention has been disclosed in connection with the preferred embodiments thereof, it should be understood that there may be other embodiments which fall within the spirit and scope of the invention as defined by the following claims.

We claim:

1. A method of forming micro heat pipe panels having a desired shape and having a desired heat pipe configuration and texture, comprising the steps of:

a. arranging at least one layer of substantially parallel filaments such that the filament arrangement corresponds to the desired shape of the micro heat pipe panel, wherein the size, shape and texture of the filaments correspond to the desired heat pipe configuration and texture, and the filaments are stable during the subsequent deposition step;

b. depositing a thermally conductive material on and around the filaments to form the desired shape of the micro heat pipe panel;

c. removing the filaments from the thermally conductive material to produce tubular passageways within the deposited material, each of the tubular passageways having ends with at least one end open;

d. partially filling the tubular passageways with a working fluid; and e. sealing the ends of the tubular passageways to prevent loss of the working fluid.

2. The method of claim 1, wherein conductive material is deposited said step of depositing is accomplished using hot isostatic pressing.

3. The method of claim 1, wherein said step of depositing is accomplished using vapor deposition.

4. The method of claim 3, further comprising the step of selecting the filaments from the group consisting of graphite, glass and metal.

5. The method of claim 3, further comprising the step of selecting the filaments to be molybdenum.

6. The method of claim 4, further comprising the step of selecting the thermally conductive material to be a metal.

7. The method of claim 6, further comprising the step of selecting the metal to be a superalloy.

8. The method of claim 6, further comprising the step of selecting the metal from the group of materials consisting of tungsten, tungsten-rhenium, molybdenum-rhenium, columbium, aluminum and copper.

9. A method of forming a micro heat pipe laminate comprising the steps of:

a. arranging a plurality of filaments into groups having two or more of the, plurality of filaments spaced apart from one another in a substantially parallel fashion in a common plane;

b. depositing a thermally conductive material on and around the two or more of the plurality of filaments for each of the, plurality of groups to form a corresponding plurality of panels;

c. removing the two or more of the plurality of filaments from each of the plurality of panels to produce parallel tubular passageways within each of the plurality of panels, each of the tubular passageways having ends with at least one end open;

d. partially filling the tubular passageways with a working fluid;

e. sealing the ends of the tubular passageways to prevent loss of the working fluid;

f. layering the plurality of panels on top of one another such that the thermal conductivity between adjacent micro heat pipe panels is maintained;

g. orienting the plurality of panels so layered such that the parallel tubular passageways associated with the plurality of panels are aligned along a plurality of angles; and h. bonding the the so layered and oriented plurality of panels to one another.

10. The method of claim 9, wherein said step of depositing is accomplished using hot isostatic pressing.

11. The method of claim 9, wherein said step of depositing is accomplished using vapor deposition.

12. The method of claim 11, further comprising the step of selecting the plurality of filaments from the group consisting of graphite, glass and metal.

13. The method of claim 11, further comprising the step of selecting the plurality of filaments to be molybdenum.

14. The method of claim 12, further comprising the step of selecting the thermally conductive material to be a metal.

15. The method of claim 14, further comprising the step of selecting the metal to be a superalloy.

16. The method of claim 14, further comprising the step of selecting the metal from the group of materials consisting of tungsten, tungsten-rhenium, molybdenum-rhenium, columbium, aluminum and copper.

* * * * *